(12) United States Patent
Nishimoto et al.

(10) Patent No.: US 7,423,886 B2
(45) Date of Patent: Sep. 9, 2008

(54) ELECTRONIC MEMBER AND ROTARY ELECTRONIC COMPONENT

(75) Inventors: Takumi Nishimoto, Okayama (JP); Jun Sugahara, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 206 days.

(21) Appl. No.: 11/350,577

(22) Filed: Feb. 9, 2006

(65) Prior Publication Data

US 2006/0209518 A1 Sep. 21, 2006

(30) Foreign Application Priority Data

Mar. 17, 2005 (JP) ............... 2005-076810

(51) Int. Cl.
*H05K 7/02* (2006.01)
(52) U.S. Cl. .............. 361/807; 361/760; 361/809; 200/314
(58) Field of Classification Search ........... 361/752, 361/753, 824, 828, 807, 808, 809, 810, 760; 200/4, 5 R, 334, 7, 341, 645, 336, 14, 17 R, 200/18, 11 R
See application file for complete search history.

(56) References Cited

U.S. PATENT DOCUMENTS

| | | | |
|---|---|---|---|
| 4,769,684 A * | 9/1988 | Crocker et al. ............... 257/99 |
| 4,797,520 A * | 1/1989 | Spazierer et al. ............ 200/295 |
| 4,807,091 A | 2/1989 | Obata | |
| 5,399,820 A * | 3/1995 | Silfvast ...................... 200/314 |
| 5,455,399 A * | 10/1995 | Kohno et al. ................ 200/341 |
| 5,651,450 A * | 7/1997 | Priesemuth .................. 200/314 |
| 6,420,667 B1 * | 7/2002 | Miwa et al. ...................... 200/4 |
| 6,555,770 B2 * | 4/2003 | Kawase ........................ 200/18 |
| 6,646,211 B2 * | 11/2003 | Taniuchi et al. ................ 200/4 |
| 6,667,446 B1 * | 12/2003 | Schuberth et al. .............. 200/4 |
| 6,927,351 B2 * | 8/2005 | Ashton ........................ 200/293 |
| 7,009,127 B2 * | 3/2006 | Hoelzle et al. ............... 200/315 |
| 7,049,535 B2 * | 5/2006 | Matsuyama et al. ......... 200/310 |
| 7,091,434 B2 * | 8/2006 | Suzuki ........................ 200/316 |

FOREIGN PATENT DOCUMENTS

JP 2001-229779 8/2001

\* cited by examiner

*Primary Examiner*—Dean A. Reichard
*Assistant Examiner*—Dameon E. Levi
(74) *Attorney, Agent, or Firm*—Ratner/Prestia

(57) ABSTRACT

An electronic member capable of reducing a loss of light until reaching the end of an operation shaft and enhancing the illumination intensity at the end of the operation shaft, and a rotary electronic component constituting the electronic member. The electronic member includes a rotary electronic component having a hollow hole penetrating in a direction of a shaft, a wiring board on which the rotary electronic component is mounted, an illuminating device mounted on the wiring board at one end of the hollow hole, and a light guide body being inserted in the hollow hole and guiding light emitted from the illuminating device to another end of the hollow hole.

6 Claims, 3 Drawing Sheets

[Fig. 4]
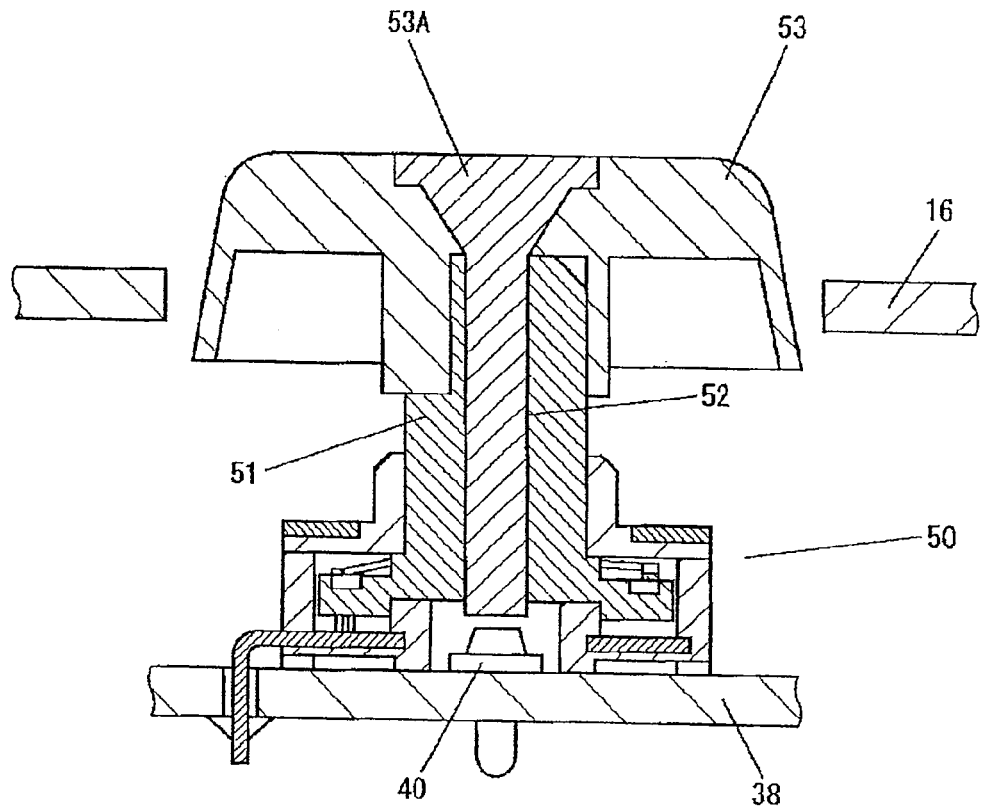
[Fig. 5] PRIOR ART
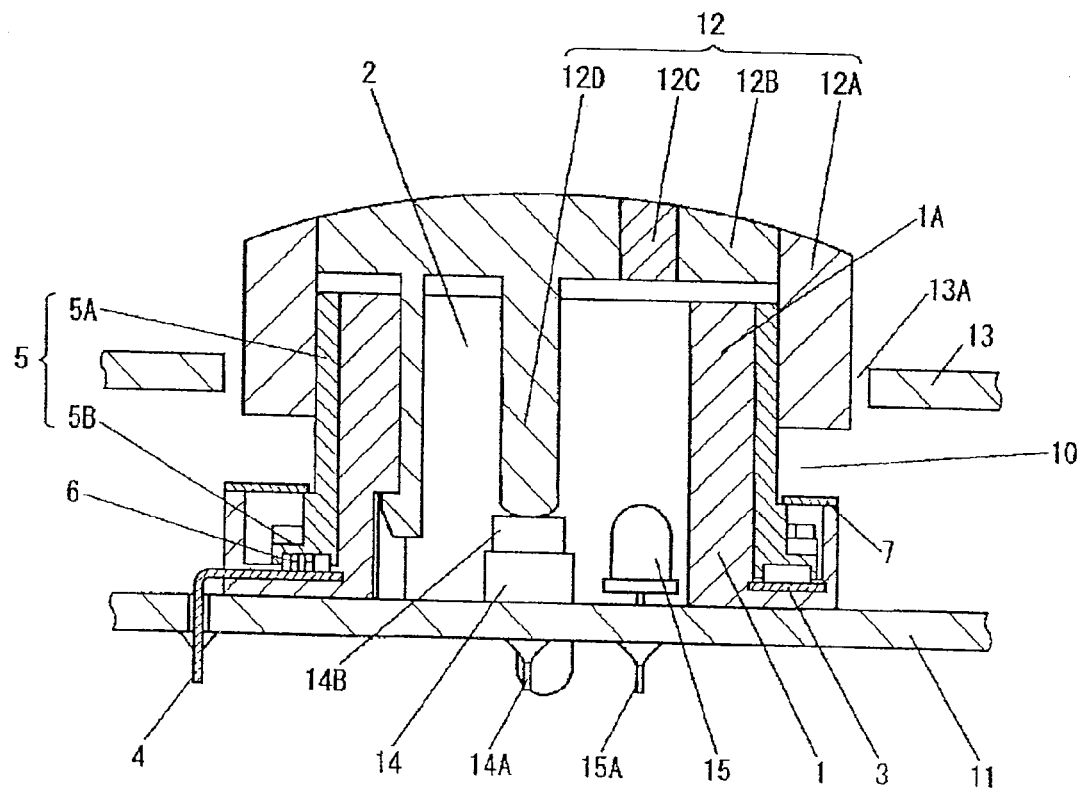

ELECTRONIC MEMBER AND ROTARY ELECTRONIC COMPONENT

BACKGROUND OF THE INVENTION

1. Field of the Invention

The present invention relates to an electronic member having an illuminating device used in an operation portion of various electronic equipment and a rotary electronic component constituting the same.

2. Background Art

Recently, various electronic equipment such as an audiovisual equipment has been smaller in size and shorter in height. Furthermore, a mounting form in which an operation knob is illuminated from the inside has been increased and its illumination state has been demanded to be brighter and more visible. A conventional electronic member with an illuminating device used in such electronic equipment and a rotary electronic component constituting the electronic member are described taken a rotary encoder as an example.

FIG. 5 is a cross-sectional view showing a configuration of a conventional electronic member including a rotary electronic component. In FIG. 5, firstly, a configuration of a conventional electronic member including rotary encoder 10 that is a rotary electronic component is described. In FIG. 5, case 1 is made of an insulating resin and has a substantially annular outer shape. A portion forming a substantially annular-shaped inner peripheral wall makes cylindrical portion 1A. The inside of cylindrical portion 1A is hollow hole 2. Substantially annular-shaped case 1 is open upwardly and stationary contact 3 is disposed in a predetermined pattern on the bottom surface of the open portion. Terminal 4 that is conducting to stationary contact 3 extends to the outside of case 1.

Operation shaft 5 is made of an insulating resin that has a penetrating central portion. Sliding contact 6 is attached to the lower surface of flange portion 5B provided at the lower part of substantially cylindrical-shaped operation portion 5A. Operation shaft 5 is disposed on case 1 in a way in which the inner surface of substantially cylindrical-shaped operation portion 5A is rotatably combined with the outer surface of the cylindrical portion 1A. Cover 7 is attached to case 1 in a way in which it closes the open portion of case 1 and cover 7 is made of a metal plate. Cylindrical portion 1A and operation portion 5A combined with the outer peripheral side of cylindrical portion 1A protrude upwardly from a hole at the center of cover 7. Rotary encoder 10 as a conventional rotary electronic component is configured as mentioned above.

Rotary encoder 10 is mounted on wiring board 11 of electronic equipment (not shown) via terminal 4 by soldering. Furthermore, operation knob 12 is installed on operation portion 5A. The upper part of operation knob 12 protrudes from hole 13A of panel 13 of electronic equipment. Inside hollow hole 2 of rotary encoder 10, push-on switch 14 for producing an ON signal by pressing operation and LED 15 as an illuminating device are disposed. Wire leads 14A and 15A of push-on switch 14 and LED 15 are also attached to wiring board 11 by soldering, respectively.

Operation knob 12 has a double configuration composed of outer peripheral portion 12A at the outer side and middle portion 12B at the inner side. Outer peripheral portion 12A is attached to operation portion 5A of operation shaft 5 and operation shaft 5 can be rotated by the rotation of outer peripheral portion 12A.

On the other hand, middle portion 12B configured so that it is not rotated in accordance with the rotation of outer peripheral portion 12A is combined with cylindrical portion 1A movably up and down. In a position of middle portion 12B corresponding to a position above LED 15, light guide portion 12C formed of a light-transmitting translucent material such as acrylic resin is fitted. Furthermore, similarly, in a position corresponding to push-on switch 14, pressing portion 12D suspending downwardly is provided. The lower end of pressing portion 12D is brought into contact with the upper surface of driving portion 14B of push-on switch 14.

In this configuration, when outer peripheral portion 12A of operation knob 12 is rotated, operation shaft 5 of rotary encoder 10 is rotated, thereby allowing sliding contact 6 installed on the lower surface of flange portion 5B to rotate and slide on stationary contact 3. Sliding contact 6 and stationary contact 3 are electrically brought into contact with each other and broken so as to produce encoder signals. Furthermore, when middle portion 12B of operation knob 12 is pressed, pressing portion 12D depresses driving portion 14B of push-on switch 14 to allow a switch to operate. Thus, an ON signal is produced and LED 15 emits light. This light illuminates a portion of light guide portion 12C of operation knob 12 located in a position above hollow hole 2.

In middle portion 12B in a usual state in which a pressing operation is not carried out, pressing portion 12D receives an urging force upwardly from driving portion 14B of push-on switch 14. When the pressing operation is stopped, push-on switch 14 becomes in an OFF state, LED 15 is turned off, and middle portion 12B returns to the original position. The above-mentioned conventional configuration of an electronic member including a rotary electronic component is disclosed in, for example, Japanese Patent Unexamined Publication No. 2001-229779.

However, in such a rotary encoder having an illuminating device, which is a conventional electronic member including a rotary electronic component, since light guide portion 12C of operation knob 12 is disposed above hollow hole 2 formed by cylindrical portion 1A and located in a position apart from LED 15, it is necessary to use high intensity type LED 15 in order to obtain a brighter illumination state of light guide portion 12. Thus, the cost tends to be increased. Furthermore, light reflect diffusely in space between LED 15 attached to wiring board 11 and the operation knob to thus reduce the amount of light reaching light guide portion 12C of operation knob 12, which may lead to reduction of illumination intensity.

SUMMARY OF THE INVENTION

The present invention provides an electronic member capable of reducing the loss of light until reaching an operation shaft and enhancing the illumination intensity in the operation shaft, and a rotary electronic component constituting the electronic member.

The electronic member of the present invention includes a rotary electronic component having a hollow hole penetrating in a direction of a shaft, a wiring board on which the rotary electronic component is mounted, an illuminating device mounted on the wiring board at one end of the hollow hole, and a light guide body being inserted in the hollow hole and guiding light emitted from the illuminating device to another end of the hollow hole. Thus, by the light guide body inserted in the hollow hole, light emitted from the illuminating device can be efficiently guided to the upper part of the end of the hollow hole without causing diffused reflection of light unlike the case where light passes through the air in space. Therefore, when the operation knob is installed on the end of the operation shaft, the loss of light until the light is guided to the operation knob can be reduced and the illumination intensity in the operation knob can be enhanced.

Furthermore, in the electronic member of the present invention, the illuminating device may be surface-mounted on the wiring board. Thus, the hollow hole can be made small in size and also short in the height direction, and an electronic member that is small in size and short in height can be obtained.

Furthermore, an outer peripheral side surface of the light guide body may be formed to have a mirror surface. Thus, light leaking to the outside of the side surface of the light guide body can be reduced and light from the illuminating device can be guided to the end of the operation shaft efficiently.

Furthermore, in the electronic member of the present invention, the rotary electronic component may include a protrusion surrounding a periphery of the illuminating device. Thus, light leakage along the direction of the wiring board can be reduced, enabling the illumination intensity efficiency to be enhanced.

Furthermore, in the electronic member of the present invention, the light guide body may be integrated with an operation knob by which a user operates the rotary electronic component. Thus, a connection loss between the light guide body and the operation knob can be reduced and further constituting members can be reduced.

BRIEF DESCRIPTION OF THE DRAWINGS

FIG. 5 is a cross-sectional view showing a configuration of a conventional electronic member including a rotary electronic component.

DETAILED DESCRIPTION OF THE PREFERRED EMBODIMENTS

Figure 1:
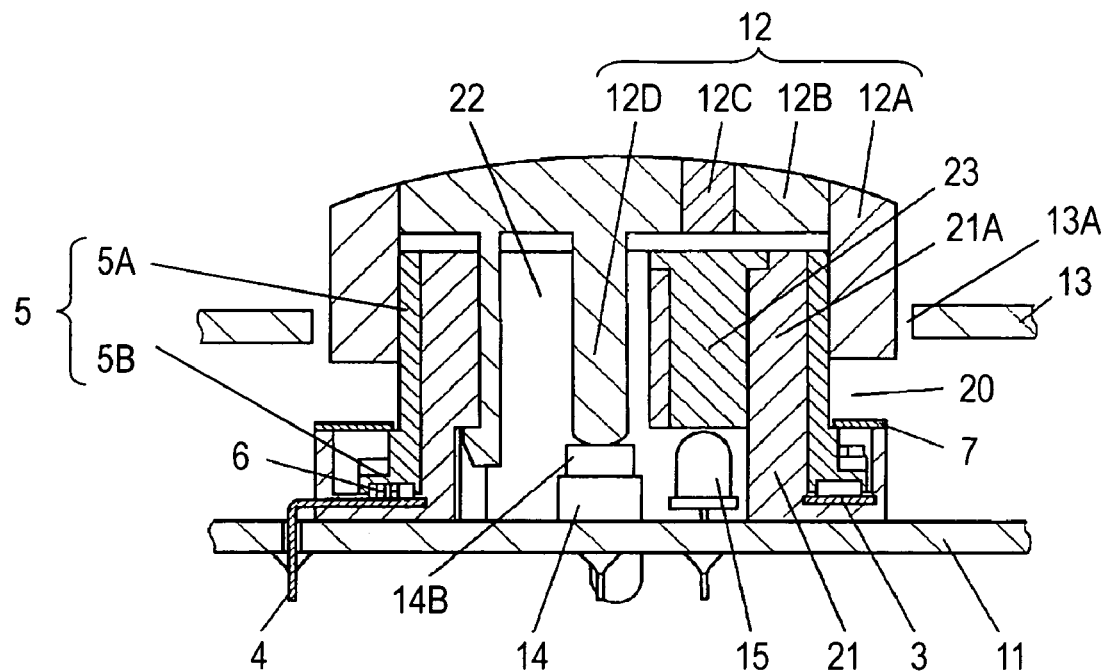
FIG. 1 is a cross-sectional view showing a configuration of an electronic member including a rotary electronic component in accordance with a first embodiment of the present invention.

Hereinafter, embodiments of the present invention are described with reference to drawings.

Note here that as in the conventional example, a rotary electronic component is described taken a rotary encoder as an example. Furthermore, the same reference numerals are given to the same configurations as those described in "Background Art" and detailed description therefor is omitted herein.

First Embodiment

FIG. 1 is a cross-sectional view showing a configuration of an electronic member including a rotary electronic component in accordance with a first embodiment of the present invention. In FIG. 1, firstly, a configuration of an electronic member including rotary encoder 20 that is a rotary electronic component of this embodiment is described.

In FIG. 1, case 21 is made of an insulating resin and has an outer shape that is substantially annular and open upwardly. The substantially annular-shaped inner peripheral wall portion makes cylindrical portion 21A and the inside thereof is hollow hole 22. Stationary contact 3 is disposed on the bottom surface in the open portion. Terminal 4 connected to stationary contact 3 is extended to the outside of case 21. In operation shaft 5, the inner surface of substantially cylindrical-shaped operation portion 5A is rotatably fitted in the outer surface of cylindrical portion 21A, and sliding contact 6 fixed to the lower surface of flange portion 5B located in the lower part of the operation portion 5A is brought into elastic contact with the bottom surface in the open portion of case 21. Cover 7 is attached to case 21 in a way in which it closes the open portion.

The above-mentioned portions are substantially the same as those in the conventional example. However, rotary encoder 20 has a configuration in which light guide body 23 made of a light-transmitting translucent material is inserted and held in hollow hole 22 formed by cylindrical portion 21A of case 21. That is to say, cylindrical portion 21A is provided with a holding portion protruding to the side of hollow hole 22 and light guide body 23 is held by the holding portion.

Rotary encode 20 configured as mentioned above is attached to wiring board 11 of electronic equipment (not shown) via terminal 4 by soldering. Furthermore, on predetermined positions on wiring board 11 in hollow hole 22 of rotary encoder 20, push-on switch 14 and LED 15 are soldered, respectively. On operation shaft 5, operation knob 12 having a double configuration composed of outer peripheral portion 12A and middle portion 12B is installed. The upper part of operation knob 12 protrudes from hole 13A of panel 13 of electronic equipment, so that it can be operated.

Operation knob 12 includes outer peripheral portion 12A attached to operation portion 5A and middle portion 12B combined with cylindrical portion 21A constituting hollow hole 22 movably up and down. In a position of middle portion 12B corresponding to LED 15, light guide portion 12C made of a light transmitting translucent material is fitted. The lower end of pressing portion 12D protruding downwardly from the lower surface of middle portion 12B is brought into contact with driving portion 14B of push-on switch 14.

Light guide body 23 inserted in hollow hole 22 has, for example, a substantially stick shape. The lower end that is one end of light guide body 23 is located immediately above LED 15. The upper end that is another end located at the same height as the upper end of cylindrical portion 21A faces light guide portion 12C of operation knob 12 with a distance that is slightly larger than the operation distance of push-on switch 14.

In the above-mentioned configuration, when outer peripheral portion 12A of operation knob 12 is rotated, operation shaft 5 of rotary encoder 20 integrally fixed to outer peripheral portion 12A is rotated. Thereby, sliding contact 6 on the lower surface of flange portion 5B rotates and slides on stationary contact 3 so as to produce encoder signals. When middle portion 12B of operation knob 12 is depressed, middle portion 12B moves downwardly and the lower surface of pressing portion 12D presses driving portion 14B of push-on switch 14 so as to operate switch and produce ON signals. At the same time, LED 15 emits light.

Light emitted from LED 15 enters the inside of light guide body 23 located immediately above LED 15, passes through light guide body 23 and reaches light guide portion 12C of operation knob 12 at the upper part. Thus, light guide portion 12C is illuminated. At this time, in this embodiment, since light guide body 23 is disposed in hollow hole 22 and the lower end thereof is located immediately above LED 15, light is prevented from reflecting diffusely or scattering when light passes through space inside a hollow hole as in a conventional example. Therefore, light emitted from LED 15 can be allowed to pass through light guide body 23 efficiently and can be guided to the upper part of hollow hole 22. Thus, illumination intensity can be enhanced.

When depressing of middle portion 12B of operation knob 12 is stopped, push-on switch 14 returns to the original OFF state by its self-resilience and illumination of LED 15 is stopped. Middle portion 12B also returns to the original upper position by an urging force from driving portion 14B of push-on switch 14. Note here that when a spring (not shown in figure) for always urging middle portion 12B to the upper side is incorporated into operation knob 12, when no pressing force is applied, middle portion 12B can be securely maintained in the upper position by an urging force of the spring.

As mentioned above, in the configuration of this embodiment, since light from LED 15 can be guided to the upper part of hollow hole 22 efficiently, the illumination intensity of light guide portion 12C of operation knob 12 attached to operation shaft 5 can be enhanced.

Figure 2:
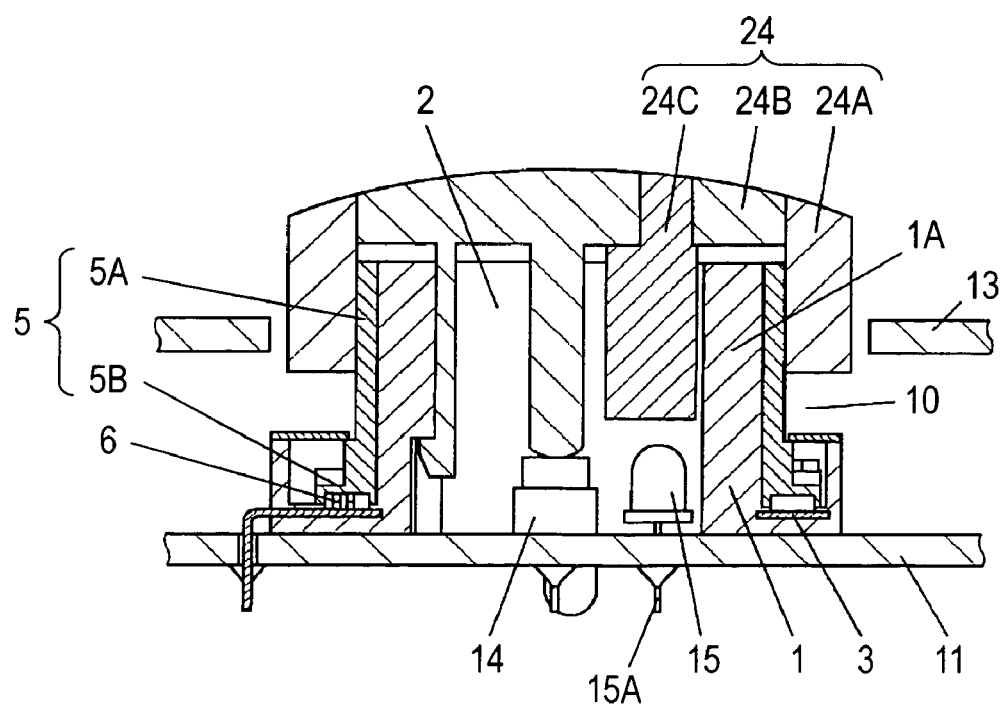
FIG. 2 is a cross-sectional view showing another configuration of an electronic member including a rotary electronic component in accordance with the first embodiment.

Note here that the above-mentioned idea can be applied to conventional rotary encoder 10 as a rotary electronic component. FIG. 2 is a cross-sectional view showing another configuration of an electronic member including a rotary electronic component in accordance with this embodiment. As shown in FIG. 2, operation knob 24, which has a double configuration composed of outer peripheral portion 24A at the outer side and middle portion 24B at inner side and in which middle portion 24B is provided with light guide portion 24C made of a light-transmitting translucent material and protruding downwardly so as to be integrated with a light guide body, is used and incorporated so that light guide portion 24C is inserted in hollow hole 2 of rotary encoder 10 and the position of the lower end faces a portion immediately above LED 15 attached to wiring board 11 via wire leads 15A by soldering.

Note here that also in this configuration, outer peripheral portion 24A of operation knob 24 is attached to operation portion 5A of rotary encoder 10 in a way in which it can rotate operation shaft 5, and middle portion 24B is combined with cylindrical portion 1A movably up and down. That is to say, in the embodiment shown in FIG. 2, instead of disposing light guide body 23, in a state in which it is inserted in hollow hole 22, in rotary encoder 20, the lower part of light guide portion 24C itself of operation knob 24 is extended so as to be integrated with the light guide body, and light guide portion 24C itself that is integrated with the light guide body is inserted in a portion immediately above LED 15 inside hollow hole 2 of rotary encoder 10.

Note here that the lower end of light guide portion 24C is maintained in the vicinity of the upper part of LED 15 with a distance that is slightly larger than the operation distance of push-on switch 14 so that it is not brought into contact with LED 15 even when middle portion 24B of operation knob 24 is pushed so as to press push-on switch 14. Since the other configurations are the same as those in FIG. 1, detailed description therefor is omitted herein.

Also in the above-mentioned embodiment, light emitted from LED 15 hardly passes through the air inside hollow hole 2 and enters light guide portion 24C, disposed immediately above LED 15, which is integrated with the light guide body of operation knob 24. The light that has passed through light guide portion 24C illuminates the upper portion of light guide portion 24C. Therefore, this configuration also allows the light emitted from LED 15 to reach the upper surface of operation knob 24 efficiently. Thus, the illumination intensity can be enhanced. Furthermore, since light guide portion 24C that is integrated with a light guide body is integrated with operation knob 24, constituting members can be reduced.

Second Embodiment

Figure 3:
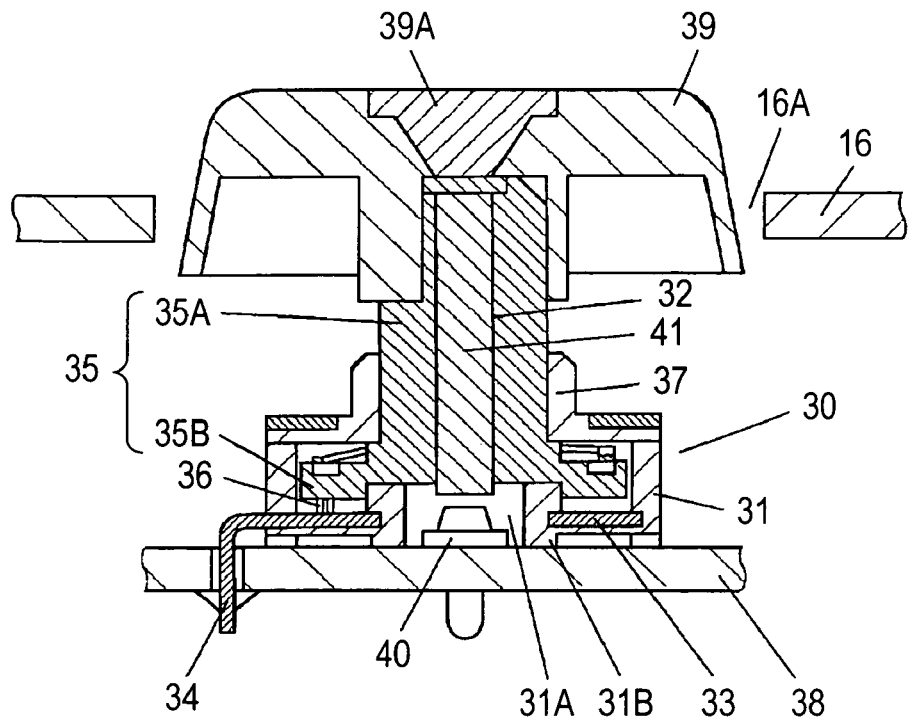
FIG. 3 is a cross-sectional view showing a configuration of an electronic member including a rotary electronic component in accordance with a second embodiment of the present invention.

FIG. 3 is a cross-sectional view showing a configuration of an electronic member including a rotary electronic component in accordance with a second embodiment of the present invention. Note here that the same reference numerals are given to the same configurations as those described in the first embodiment and detailed description therefor is omitted herein. In FIG. 3, firstly, a configuration of the electronic member including rotary encoder 30 that is a rotary electronic component of this embodiment is described.

In FIG. 3, case 31 has a substantially box shape that is open upwardly and has inside hole 31A penetrating in the vertical direction in the middle position on the bottom surface of the open portion and cylindrical protrusion portion 31B protruding in a cylindrical shape from the lower surface around inside hole 31A as a center. On the bottom surface of the open portion of case 31, stationary contact 33 formed in a predetermined pattern is disposed. Operation shaft 35 includes a substantially stick-shaped operation portion 35A at the upper part and flange portion 35B at the lower part, which are integrated with each other and is disposed in a way in which flange portion 35B is contained in the open portion of case 31.

Operation shaft 35 has hollow hole 32 penetrating from the lower part though the upper part. Into hollow hole 32, stick-shaped light guide body 41, which has a mirror-surfaced outer peripheral side surface and is made of a translucent material such as acrylic resin, is fitted. The upper end position of light guide body 41 constitutes substantially the same surface as that of the upper surface of operation portion 35A. The lower end of light guide body 41 is located in inside hole 31A of case 31 in a state in which it is held by operation shaft 35. The upper surface of the open portion of case 31 is covered with bearing 37, and operation portion 35A of operation shaft 35 is rotatably held by a support hole of bearing 37 and protrudes upwardly. On the lower surface of flange portion 35B of operation shaft 35, sliding contact 36 that is brought into elastic contact with stationary contact 33 disposed on the bottom surface of the open portion of case 31 is fixed. Terminal 34 is led to the outside of case 31 from stationary contact 33.

Rotary encoder 30 that is a rotary electronic component of this embodiment is configured as mentioned above and mounted on wiring board 38 of electronic equipment (not shown) via terminal 34 by soldering. On the position of wiring board 38 corresponding to a position in hollow hole 32, surface-mounted type LED 40 as an illuminating device is disposed by soldering. The lower end of light guide body 41 disposed on operation shaft 35 of rotary encoder 30 faces a portion immediately above surface-mounted type LED 40 with little space therebetween. The electronic member of this embodiment is configured as mentioned above.

Note here that surface-mounted type LED 40 is made thin in thickness and small in size. Accordingly, hollow hole 32 of operation shaft 35 into which light guide body 41 is fitted may be also small and the dimension in the height direction can be made small. An electronic member including a rotary electronic component can be made small in size and short in height. At the upper end of operation shaft 35, operation knob 39 is attached. The upper part of operation knob 39 protrudes from hole 16A provided in panel 16 of electronic equipment and can be rotated by fingers, and the like.

In operation knob 39, light guide portion 39A made of a transparent translucent material is fitted. The lower surface of light guide portion 39A is adjacent to and faces the upper surface of light guide body 41 that is inserted in hollow hole 32 of operation shaft 35. Cylindrical protrusion portion 31B formed in a protruding state on the lower surface of case 31 is mounted on wiring board 38 in a state in which the lower end thereof is brought into contact with wiring board 38 with little space therebetween. The vicinity of surface-mounted type LED 40 is surrounded by cylindrical protrusion portion 31B.

In the above-mentioned configuration, when operation knob 39 is rotated, operation shaft 35 of rotary encoder 30 is rotated, thereby allowing sliding contact 36 on the lower surface of flange portion 35B to rotate and slide on stationary contact 33. Thus, sliding contact 36 and stationary contact 33 are electrically brought into contact with each other and broken so as to produce encoder signals. Furthermore, when surface-mounted type LED 40 emits light, the light passes through the inside of light guide body 41 located immediately above LED 40. Furthermore, the light passes through light guide portion 39A fitted in operation knob 39 and then the upper surface portion is illuminated.

At this time, cylindrical protrusion portion 31B protruding in a substantially cylindrical shape from the lower surface of case 31 to the side of wiring board 38 is disposed on the wiring board 38 without space therebetween so that it surrounds the vicinity around surface-mounted type LED 40. Therefore, light emitted from surface-mounted type LED 40 can be prevented from leaking in the direction of the surface of wiring board 38. Thus, the efficiency of the illumination state on the upper surface of operation knob 39 is enhanced.

Note here that when the outer peripheral side surface of light guide body 41 to be fitted in hollow hole 32 of operation shaft 35 is formed to have a mirror surface as in this configuration, when light emitted from surface-mounted type LED 40 passes through light guide body 41, light traveling in the direction to the outside in light guide body 41 is reflected by mirror surfaced outer peripheral side surface. Thus, it is preferable that the leakage of light from the outer peripheral side surface can be reduced. When a reflective film is formed on the outer peripheral side surface of light guide body 41 by aluminum evaporation, and the like, the passed light is totally reflected inside. Therefore, the illumination intensity efficiency is further enhanced.

Figure 4:
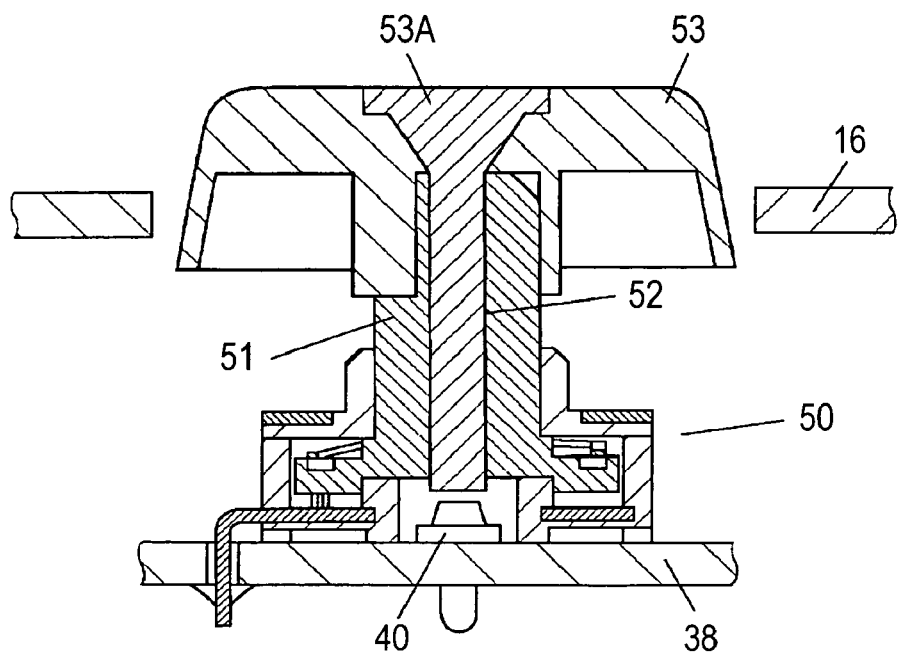
FIG. 4 is a cross-sectional view showing another configuration of an electronic member including a rotary electronic component in accordance with the second embodiment.

Furthermore, instead of light guide body 41 fitted in operation shaft 35 as shown in FIG. 3, a configuration shown in FIG. 4 may be employed. FIG. 4 is a cross-sectional view showing another configuration of an electronic member including a rotary electronic component in accordance with this embodiment. As show in FIG. 4, light guide portion 53A fitted in operation knob 53 may be extended long downwardly to be integrated with a light guide body and inserted in hollow hole 52 provided in operation shaft 51 of rotary encoder 50 in a way in which the lower end of light guide portion 53A is located in the vicinity of a portion immediately above surface-mounted LED 40. Note here that the other configurations are the same as those shown in FIG. 3 and therefore description therefor is omitted herein.

In the above-mentioned embodiment, when operation knob 53 is rotated, encoder signals are produced from rotary encoder 50 and light is emitted from surface-mounted type LED 40. Then, the light enters light guide portion 53A provided in operation knob 53 located immediately above and the light that passes through the inside of light guide portion 53A illuminates a portion exposed to the upper surface of operation knob 53.

Also in the above-mentioned embodiment, since the light emitted from surface-mounted type LED 40 directly enters light guide portion 53A located immediately above, diffused reflection of light in the air is reduced and the light reaches the upper surface of operation knob 53 efficiently. Thus, the electronic member of the above-mentioned embodiment is useful as an electronic member including a rotary electronic component having the enhanced illumination intensity. Note here that in the configuration, since light guide portion 53A integrated with the light guide body is fixed to operation knob 53, a light guide body is not required to be provided in hollow hole 52 of rotary encoder 50, thus reducing constituting members.

Note here that in the above-mentioned embodiments, the case where the rotary electronic component is a rotary encoder is described. However, the present invention is not limited thereto. For example, the present invention may be applied to rotary electronic component as a whole, for example, a variable resistor, a rotary switch, and the like.

As mentioned above, the electronic member according to the present invention includes a rotary electronic component having a hollow hole penetrating in a direction of a shaft, a wiring board on which the rotary electronic component is mounted, an illuminating device mounted on the wiring board at one end of the hollow hole, and a light guide body being inserted in the hollow hole and guiding light emitted from the illuminating device to another end of the hollow hole. Therefore, by the light guide body inserted in the hollow hole, light emitted from the illuminating device can be guided to the upper part of the end of hollow hole efficiently without causing diffused reflection of light unlike the case where light passes through the air. When an operation knob is installed on the end of the operation shaft, loss of light until it is guided to the operation knob can be reduced, thus enhancing the illumination intensity of the operation knob. Therefore, the electronic member according to the present invention is useful as an electronic member having an illumination device and the like used in an operation portion of various electronic equipment.

What is claimed is:

1. An electronic member comprising:
    a rotary electronic component having a hollow hole penetrating in a direction of a shaft;
    a wiring board on which the rotary electronic component is mounted;
    a push-on switch including a movably configured portion having an operation distance defined by a distance of moving from a non-contact position to a position in which an ON signal is produced;
    an illuminating device mounted on the wiring board at one end of the hollow hole; and
    a light guide body being inserted in the hollow hole and guiding light emitted from the illuminating device to another end of the hollow hole,
    wherein the light guide body includes a first portion and a second portion separated from each other by a distance greater than the operation distance of the push-on switch.

2. The electronic member of claim 1, wherein the illuminating device is surface-mounted on the wiring board.

3. The electronic member of claim 1, wherein an outer peripheral side surface of the light guide body is formed to have a mirror surface.

4. The electronic member of claim 1, wherein the rotary electronic component comprises a protrusion surrounding a periphery of the illuminating device.

5. The electronic member of claim 1, wherein the light guide body is integrated with an operation knob by which a user operates the rotary electronic component.

6. A rotary electronic component operated by rotating a shaft, which comprises a mounting portion to be mounted on a wiring board, wherein the shaft has a hollow hole penetrating in a direction of the shaft; and the hollow hole has a structure including an illuminating device at one end and a light guide body that is adjacent to the illuminating device and guides light emitted from the illuminating device to another end of the hollow holes, a push-on switch is coupled to the wiring board, the push-on switch including a movably configured portion having an operation distance defined by a distance of moving from a non-contact position to a position in which an ON signal is produced, and a light guide body is inserted in the hollow hole and the light guide body includes a first portion and a second portion separated from each other by a distance greater than the operation distance of the push-on switch.

* * * * *

UNITED STATES PATENT AND TRADEMARK OFFICE
CERTIFICATE OF CORRECTION

| | | |
|---|---|---|
| PATENT NO. | : 7,423,886 B2 | Page 1 of 1 |
| APPLICATION NO. | : 11/350577 | |
| DATED | : September 9, 2008 | |
| INVENTOR(S) | : Takumi Nishomoto et al. | |

It is certified that error appears in the above-identified patent and that said Letters Patent is hereby corrected as shown below:

At Column 9, line 12, "hollow holes," should read --hollow hole,--

Signed and Sealed this

Twenty-fourth Day of February, 2009

JOHN DOLL
*Acting Director of the United States Patent and Trademark Office*